US009570437B2

(12) United States Patent
Boos et al.

(10) Patent No.: US 9,570,437 B2
(45) Date of Patent: Feb. 14, 2017

(54) SEMICONDUCTOR DIE, INTEGRATED CIRCUITS AND DRIVER CIRCUITS, AND METHODS OF MAUFACTURING THE SAME (71) Applicant: NXP B.V., Eindhoven (NL)

(72) Inventors: Priscilla Boos, Molenhoek (NL); Rob van Dalen, Bergeijk (NL); Erik Spaan, Elst Gld (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/279,605

(22) Filed: May 16, 2014

(65) Prior Publication Data

US 2015/0194421 A1 Jul. 9, 2015

Related U.S. Application Data (63) Continuation-in-part of application No. 14/151,576, filed on Jan. 9, 2014, now abandoned.

(30) Foreign Application Priority Data

Apr. 2, 2014 (EP) .................................... 14163220

(51) Int. Cl.
*H01L 27/06* (2006.01)
*H01L 21/762* (2006.01)
(Continued)

(52) U.S. Cl.
CPC ..... *H01L 27/0623* (2013.01); *H01L 21/76221* (2013.01); *H01L 21/76227* (2013.01);
(Continued)

(58) Field of Classification Search
CPC ............... H01L 21/84; H01L 21/76221; H01L 21/76281; H01L 29/7302; H01L 27/0623; H01L 27/1203; H01L 21/8249; H01L 29/0649; H01L 29/402; H01L 21/76227; H01L 29/66613; H01L 29/66704; H01L 29/66681; H01L 29/7816; H01L 29/7824; H01L 29/404; H01L 29/861; H01L 29/78624; H01L 29/7394; H01L 29/7436
See application file for complete search history.

(56) References Cited

U.S. PATENT DOCUMENTS 5,116,771 A 5/1992 Karulkar
5,246,870 A * 9/1993 Merchant ............. H01L 29/402
257/347

(Continued)

FOREIGN PATENT DOCUMENTS

EP 0 553 775 A1 8/1993
JP 58-135655 8/1983
(Continued)

OTHER PUBLICATIONS

Bach, Stephane et al; "Simulation of Off-State degradation at high temperature in High Voltage NMOS transistor with STI architecture"; Proceedings of the 22$^{nd}$ Int'l Symposium on Power Semiconductor Devices & ICs, Hiroshima, JP' pp. 189-192 (Jun. 2010).
(Continued)

*Primary Examiner* — Jarrett Stark
*Assistant Examiner* — Bitew Dinke (57) ABSTRACT A semiconductor die is disclosed comprising a lateral semiconductor device on an upper major surface of a substrate, the integrated circuit comprising a silicon layer over the substrate, a recess in the silicon layer, a layer of LOCOS silicon oxide within the recess and having a grown upper surface which is coplanar with the surface of an un-recessed portion of the silicon layer, wherein the silicon layer beneath the recess has a non-uniform lateral doping profile, and is comprised in a drift region of the lateral semiconductor
(Continued)

device. A method of making such a die is also disclosed, as is an integrated circuit and a driver circuit.

14 Claims, 11 Drawing Sheets

(51) Int. Cl.
| | |
|---|---|
| *H01L 29/06* | (2006.01) |
| *H01L 21/84* | (2006.01) |
| *H01L 29/73* | (2006.01) |
| *H01L 27/12* | (2006.01) |
| *H01L 29/786* | (2006.01) |
| *H01L 29/861* | (2006.01) |
| *H01L 29/40* | (2006.01) |
| *H01L 21/8249* | (2006.01) |
| *H01L 29/739* | (2006.01) |
| *H01L 29/74* | (2006.01) |

(52) U.S. Cl.
CPC ........ *H01L 21/76281* (2013.01); *H01L 21/84* (2013.01); *H01L 27/1203* (2013.01); *H01L 29/0649* (2013.01); *H01L 29/404* (2013.01); *H01L 29/7302* (2013.01); *H01L 29/78624* (2013.01); *H01L 29/861* (2013.01); *H01L 21/8249* (2013.01); *H01L 29/402* (2013.01); *H01L 29/7394* (2013.01); *H01L 29/7436* (2013.01)

(56) References Cited

U.S. PATENT DOCUMENTS

| | | | |
|---|---|---|---|
| 5,529,947 A | 6/1996 | Okonogi | |
| 6,201,274 B1 | 3/2001 | Kanamori | |
| 6,346,451 B1 | 2/2002 | Simpson et al. | |
| 6,656,810 B1 | 12/2003 | Fukushima | |
| 2002/0005559 A1* | 1/2002 | Suzuki ............ | H01L 29/0619 257/492 |
| 2002/0052118 A1 | 5/2002 | Kobayashi | |
| 2002/0135017 A1 | 9/2002 | Vogt et al. | |
| 2004/0124490 A1 | 7/2004 | Bohr et al. | |
| 2005/0194656 A1* | 9/2005 | Shimizu ............ | H01L 29/0878 257/488 |
| 2005/0242398 A1 | 11/2005 | Chen et al. | |
| 2007/0013022 A1* | 1/2007 | Shimizu ............ | H01L 21/84 257/500 |
| 2008/0197410 A1 | 8/2008 | Chiang et al. | |
| 2009/0039425 A1* | 2/2009 | Shu ................ | H01L 29/0634 257/339 |
| 2011/0057263 A1* | 3/2011 | Tang ............... | H01L 29/1037 257/339 |
| 2011/0127602 A1* | 6/2011 | Mallikarjunaswamy ............... H01L 21/823807 257/331 |
| 2011/0133269 A1* | 6/2011 | Yamaji ............. | H01L 27/1203 257/328 |
| 2012/0009740 A1 | 1/2012 | Cheng et al. | |
| 2012/0021569 A1* | 1/2012 | Cheng ............. | H01L 29/0653 438/135 |
| 2012/0248533 A1* | 10/2012 | Van Dalen ........ | H01L 29/7824 257/337 |
| 2013/0069712 A1* | 3/2013 | Trajkovic ........ | H01L 29/7816 327/537 |
| 2013/0228873 A1* | 9/2013 | Tseng .............. | H01L 29/404 257/369 |
| 2013/0234248 A1* | 9/2013 | Suzuki ............ | H01L 21/82 257/338 |
| 2014/0008723 A1* | 1/2014 | Lin ................ | H01L 29/0634 257/336 |
| 2014/0015050 A1 | 1/2014 | Tamura | |
| 2014/0145262 A1* | 5/2014 | Pan ................ | H01L 29/7816 257/339 |
| 2014/0159103 A1* | 6/2014 | Lin ................ | H01L 29/7824 257/139 |
| 2014/0346598 A1* | 11/2014 | Han ............... | H01L 29/7835 257/345 |
| 2015/0187931 A1* | 7/2015 | Yoo ................ | H01L 29/66681 257/339 |

FOREIGN PATENT DOCUMENTS

| | | |
|---|---|---|
| JP | 4-323851 | 11/1992 |
| JP | 2002-026137 | 1/2002 |
| WO | 2006/024978 A1 | 3/2006 |
| WO | 2012/132219 A1 | 10/2012 |

OTHER PUBLICATIONS

Wolf Ph.D., Stanley; Silicon Processing for the VLSI Era—vol. 2: Process Integration; Lattice Press, Sunset Beach, CA, US; pp. 31-32 (1990).

Yanagi, Shinichiro et al: "0.15 μm BiC-DMOS technology with novel Stepped-STI N-channel LDMOS"; IEEE 21st Int'l Symposium on Power Semiconductor Devices & ICs; pp. 80-83 (Aug. 8, 2009).

Extended European Search Report for EP Patent Appln. No. 13152160.1 (May 21, 2013).

Extended European Search Report for EP Patent Appln. No. 14163220.8 (Jun. 20, 2014).

* cited by examiner

SEMICONDUCTOR DIE, INTEGRATED CIRCUITS AND DRIVER CIRCUITS, AND METHODS OF MAUFACTURING THE SAME

CROSS-REFERENCE TO RELATED APPLICATIONS

This application is a Continuation-in-part of U.S. Utility application Ser. No. 14/151,576, filed Jan. 9, 2014, which claims priority under 35 U.S.C. §119 of European patent application no. 14163220.8, filed on Apr. 2, 2014, the contents of which are incorporated by reference herein.

FIELD

This invention relates to semiconductor die and to methods of manufacturing the same, and integrated circuits and driver circuits.

BACKGROUND

Bipolar CMOS DMOS (BCD) process technology is a technology which allows the incorporation of analog components (Bipolar, CMOS, DMOS), digital components (CMOS) and lateral transistors (DMOS) onto the same die.

A primary driver of BCD process technology growth has been the recent rise of smartphones and tablets. These devices comprise multiple functions which all compete for power, such as the application processor, baseband processor, the large displays, etc. Such a device thus typically uses one or more Power Management Integrated Circuit (PMIC) chips to manage the power with minimal losses to ensure long battery life. An evolving application highly suitable for BCD process technology is motor-control, which is used in Hard Disk Drives (HDDs) to turn the spindles for example. High-density BCD process technology can be used along with a modern 32-bit microcontroller to implement sophisticated motor-control System-on-Chips (SoCs) that can implement advanced algorithms to help motors deliver the same or greater output whilst consuming less power. The range of fabrication processes required to integrate bipolar, CMOS and DMOS functionality imposes tight constraints on the processes used, and in particular the so-called thermal budgets (the times for which the device can be exposed to high temperature for, for example, growing thermal oxides), are relatively low. Moreover, as the minimum-feature-size requirements of processing technology continues to shrink, for instance by the increased use of so-called advanced nodes, or deep sub-micron process technology, there is an increased requirement for highly planar surfaces, that is to say with little or no surface topography, in order to meet the requirement of lithography in the deep sub-micron range.

In a separate branch of semiconductor process technology, technologies have been developed to significantly increase the breakdown voltage of semiconductor devices, such that nowadays it is possible to manufacture devices having breakdown voltages above 500V and typically up to or over on about 700V. Such technologies, often referred to as high voltage process technologies, typically involve designing lateral devices having a widely spaced apart terminals, with laterally extended drift regions designed to have reduced surface field effect (RESURF) underneath high-quality LOCOS oxide, and generally require large thermal budgets, for instance to produce relatively thick—typically up to a micron or more—LOCOS layers.

BCD processing is generally considered challenging to combine with high-voltage processing, and advanced BCD processing in particular may be considered to be incompatible with high vaulted processing, due to the conflicting thermal budget and planarity requirements.

SUMMARY

According to a first aspect there is provided a semiconductor die comprising a lateral semiconductor device on an upper major surface of a substrate, the semiconductor die comprising a silicon layer over the substrate, a recess in the silicon layer, a layer of LOCOS silicon oxide within the recess and having a grown upper surface which is coplanar with the surface of an un-recessed portion of the silicon layer, wherein the silicon layer beneath the recess has a non-uniform lateral doping profile, and is comprised in a drift region of the lateral semiconductor device.

By providing a LOCOS silicon oxide layer in a recess and designing the thickness of the LOCOS such that the grown surface of the LOCOS iscoplanar with the surface of the recess silicon layer, the requirement for planarising the surface, prior to subsequent processing, by CMP (chemo-mechanical polishing), which would normally be associated with the use of LOCOS layers, for technologies such as BCD, may be obviated.

In embodiments, the lateral semiconductor device is a high voltage device having a lateral high voltage extension and wherein the silicon layer beneath the recess comprises the high voltage extension. In comparison with, for example, deposited silicon oxide, it is known that LOCOS silicon oxide is high-quality oxide in the sense that: the stoichiometry of the material is uniform with few interface states—typically fewer than $10^{10}$ cm$^{-2}$, it is able to conduct a relative high level of charge without breaking down, that is to say, it has a relatively high charge-to breakdown value (Qbd), and the oxide has a relatively low dielectric constant, at about 3.9, whereas the dielectric constant of deposited oxide may vary between about 3.9 and about 5. Such high-quality oxide is known to be able to support higher electric fields than relatively low quality oxide, such as deposited silicon oxide, is able to support. Thus by providing LOCOS as the silicon oxide above the laterally doped silicon layer forming part of the drift region—commonly referred to as a high voltage extension region—higher voltage differences may be sustained between the ends of the oxide, than might be expected for, for instance, a deposited silicon oxide layer.

In embodiments, the recess in the silicon layer has a tapered edge. The LOCOS silicon oxide at the tapered edge may have a birds-beak profile. By providing a tapered edge, the high electric fields associated with abrupt or vertical edges, and in particular with abrupt corners, may be reduced or even avoided. This may reduce the risk of electrical breakdown during high voltage operation and made enable even higher voltage operation.

Since it is possible to accurately control the thickness of LOCOS silicon oxide layers, the amount of silicon under the recess which is consumed by the growth of the LOCOS silicon oxide may be accurately predetermined, and as a consequence, provided the thickness of that under-recess silicon layer is known, the thickness of the silicon remaining after the LOCOS growth, which silicon forms part of the drift region or high voltage extension region, may be accurately determined. Accurate determination of the thickness of this layer may be useful in device design. Furthermore, in embodiments in which the recess in the silicon layer is created by growing a sacrificial LOCOS silicon oxide layer which is then etched or stripped away, the depth of the recess, prior to growing the—non-sacrificial—LOCOS silicon oxide layer, may be accurately controlled.

Embodiments may further comprise a further LOCOS silicon oxide layer in the surface of the silicon layer adjoining or laterally adjacent to the recess, wherein the further LOCOS silicon oxide layer has a thickness which is less than that of the LOCOS silicon oxide layer. Such a silicon oxide layer is known per se and is commonly used in lateral semiconductor device, adjacent to a gate or base of the device.

There may be a polysilicon field plate extending over the further LOCOS silicon oxide layer, wherein the polysilicon field plate does not extend over the LOCOS silicon oxide layer above the non-uniformly laterally doped silicon layer. In devices having non-recessed LOCOS silicon oxide layer, the polysilicon field plate generally extends at least part of the way across the LOCOS, whereas this may not be practical in some devices having recessed LOCOS silicon oxide layer. By removing the need for the polysilicon field plate to extend beyond the further LOCOS silicon oxide layer, device fabrication may be simplified, and in some devices, there may be other advantages associated with the oxide step between the polysilicon fieldplate and the metal field-plate closer to the source.

In embodiments, the silicon layer over the substrate is spaced apart from the substrate by a buried oxide layer. That is to say, embodiments may be compatible with a SOI (silicon on insulator) device structure, such as is commonly used for high voltage devices. In other embodiments the silicon layer over the substrate comprises epitaxial silicon and is in direct contact with the substrate.

In embodiments, the lateral semiconductor device is a one of the group consisting of: a junction field effect transistor, an insulated gate field effect transistor, an insulated gate bipolar transistor, and a diode. The IC may comprise a combination of bipolar and CMOS semiconductor devices. In embodiments, the recess in the silicon layer extends for a part of distance between two main contacts of the lateral semiconductor device.

In embodiments the lateral semiconductor device comprises a channel, the channel having a minimum channel length of more than 250 nm. In other embodiments, the lateral device has a channel with a channel length of no more than 1 µm. Processes having channel lengths of less than one micron are commonly referred to as sub-micron processes, and processes having minimum channel lengths of no more than 250 nm are commonly referred to as deep sub-micron processes. It will be appreciated that in BCD processes, the minimum channel length may typically be that of a CMOS transistor, and a high-voltage transistor on the same BCD die may generally have a larger channel length.

Thus some embodiments are compatible with sub-micron processes and some embodiments are compatible with deep sub-micron processes. By providing a generally planar surface, embodiments are compatible with deep submicron semiconductor processing, for which a high degree of planarity is required on the device surface, during the fabrication process, in order to accommodate high-resolution lithographic processes. In contrast, planarising the surface by means of CMP may not be compatible with deep sub-micron processing, since the varying relaxation effects of different materials following CMP may result in inadequate planarity of the surface even after CMP. Further, due to the process tolerances in the CMP, the thickness of the remaining oxide may also be expected to be not well-defined, which is undesirable; and moreover, growing a thicker oxide an planarising it by CMP would also involve a generally undesirable longer time at high temperature for the LOCOS growth, due to the quadratic increase in oxidation time.

According to another aspect there is provided an integrated circuit comprising a semiconductor die as described above. In other embodiments, the semiconductor die may be provided as a discrete component, having only one semiconductor device structure thereon. According to a further aspect, there is provided a packaged integrated circuit or packaged discrete device comprising such a semiconductor die.

According to yet another aspect there is provided a method of manufacturing a lateral semiconductor device on an upper major surface of a substrate, the method comprising: forming a recess in a silicon layer over the substrate; locally oxidising the silicon layer within the recess to partially consume the silicon layer beneath the recess, thereby forming a LOCOS layer of silicon oxide filling the recess; wherein the upper surface of the LOCOS layer is coplanar with the surface of an un-recessed portion of the silicon layer; and doping the unconsumed silicon layer beneath the recess to form at least part of a drift region of the lateral semiconductor device. The at least part of a drift region may comprise a high voltage extension of a high-voltage lateral semiconductor device. The skilled person will appreciate that doping the unconsumed silicon layer may be carried out in more than one step, and these steps may be undertaken at different stages of the fabrication process: typically dopant atoms may be implanted into the layer prior to forming the recess and growing the recessed LOCOS; a thermal activation step, wherein the dopant atoms are substituted for lattice atoms in the silicon layer, may be undertaken at a later stage of the fabrication process, for instance after forming the recess and growing the recessed LOCOS.

In embodiments, forming a recess in a silicon layer comprises locally oxidising the silicon layer and removing the oxide formed thereby. The skilled person will be familiar with the fact that growth of a silicon oxide layer using a LOCOS process generally results in tapering—that is to say, non-vertical edges to the oxide layer. By growing such a LOCOS layer and then removing it, typically by etching with an etchant which is selective against the neighbouring and underlying silicon, the tapering edges of the oxide layer result in tapering edges to the recess.

In embodiments, the layer of silicon over the substrate is separated from the substrate by a buried oxide layer. In other embodiments the silicon layer over the substrate comprises epitaxial silicon and is in direct contact with the substrate.

In embodiments, the method may include other fabrication steps, subsequent to, between, or after those mentioned above, to result in any of the semiconductor dies, devices, or integrated circuits described above.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Figure 1:
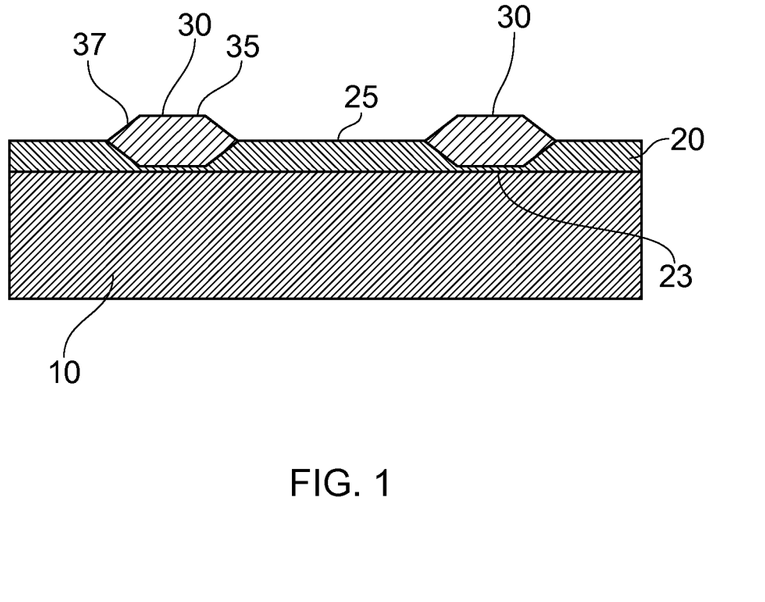
FIG. 1 illustrates a semi-recessed insulating structure formed using a LOCOS process.

FIG. 1 illustrates, in schematic form, two regions of silicon oxide formed by LOCOS (LOCal Oxidation of Silicon) 30, on a silicon substrate 10 having thereon a high-quality layer of epitaxial silicon 20, with a top surface 25. As will be described in more detail hereinbelow, the silicon oxide region is grown by exposing the underlying silicon to an oxidising atmosphere at a high temperature, and as it does so it consumes silicon from the epitaxial layer. As each atom of silicon is oxidised into a silicon oxide molecule, the volume occupied increases, by a known amount. As a result the space occupied by the silicon oxide is larger than that previously occupied by silicon, and so the silicon oxide region protrudes above the surface of the silicon. As more silicon oxide is grown and more silicon is consumed, the top surface 35 of the silicon oxide protrudes further from the surface 25 of the epitaxial silicon 20. The other point worthy of note in the present context is that the edges or ends of the silicon oxide layer are not vertical: as more silicon is consumed, the conversion to silicon oxide occurs at the sidewall and not just at the top, originally exposed, surface. As a result, the sidewalls 37 of the silicon oxide have a generally tapered profile. Skilled person will recognise that, in detail, the sidewall may take on a characteristic "birds beak" profile.

Since the thickness of the LOCOS silicon may be very accurately controlled, this technique is used for devices that require a thin lateral region, such as that shown at 23, underneath a high-quality silicon insulating region. Such a region is characteristic of high-voltage devices, which typically use the regions to provide lateral isolation allowing high-voltage operation. It is known to planarise the surface of such LOCOS oxide by using the chemop-mechanical polishing (CMP) processes; however, since CMP processes are partly mechanical, stress may result in the polished layer which typically results in imperfect planarity, as the stress is relieved following the CMP process.

Figure 2:
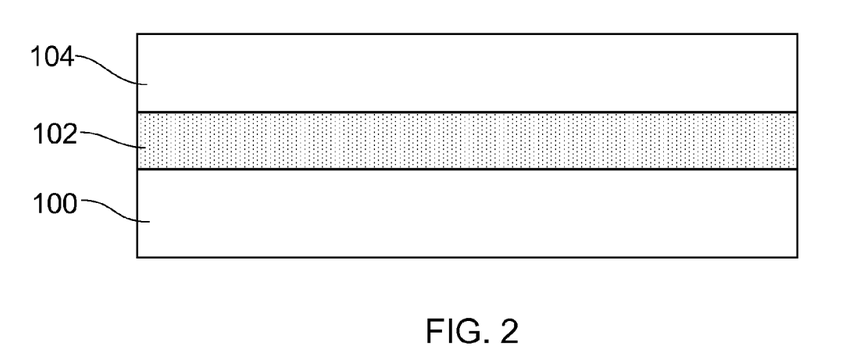
FIGS. 2-11 illustrate a process for manufacturing a semiconductor device according to one or more embodiments.

FIGS. 2-11 illustrate process steps for manufacturing a semiconductor device according to embodiments:

FIG. 2 shows a substrate 100, typically comprised of silicon, with an oxide (i.e. insulator) layer 102 formed thereon. This oxide layer 102 will be referred to as a buried oxide layer (BOX) 102 due to its resultant position in the formed structure. The thickness of the buried oxide layer may typically be 200 nm-5 µm, and for the example of a 700V device may be 3 µm. Formed on top of (and covering) the oxide layer 102, there is a silicon (Si) layer 104. Such a Si layer is typically referred to as a Silicon-on-Insulator (SOI) layer 104, and is typically grown by epitaxy, and thus also may be termed an epi layer. The thickness of the SOI 104 may typically in the range of 0.3 µm-3 µm. The choice of thickness of the SOI depends on the voltage range required for the final device, or starting material used for the process "node". The skilled person will recognise that the term process node refers to the suite of semiconductor processing steps which are designed and optimised for a particular minimum feature size.

Figure 3:
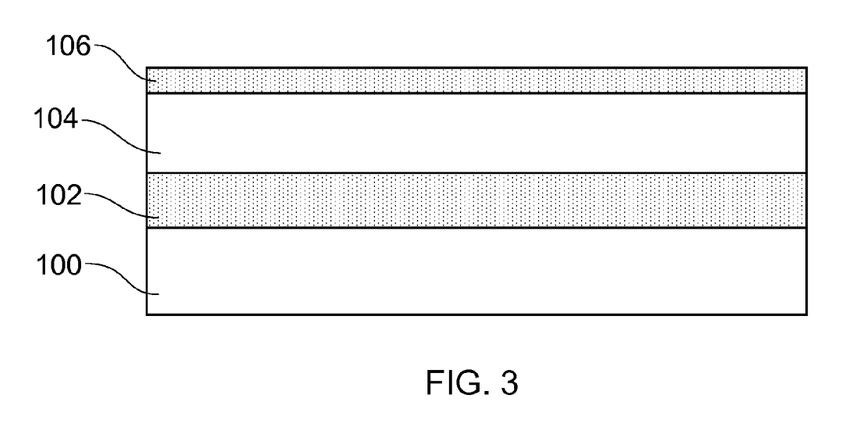

Subsequent formation of an oxide layer 106 covering the upper surface of the SOI layer 104 is illustrated in FIG. 3. The oxide layer 106 may also be referred to as a "field oxide". Here, the thickness of the oxide layer 106 is in the range of 5 nm-200 nm. Of course, other suitable materials and/or thicknesses may be used, as would be apparent to a person skilled in the art.

Figure 4:
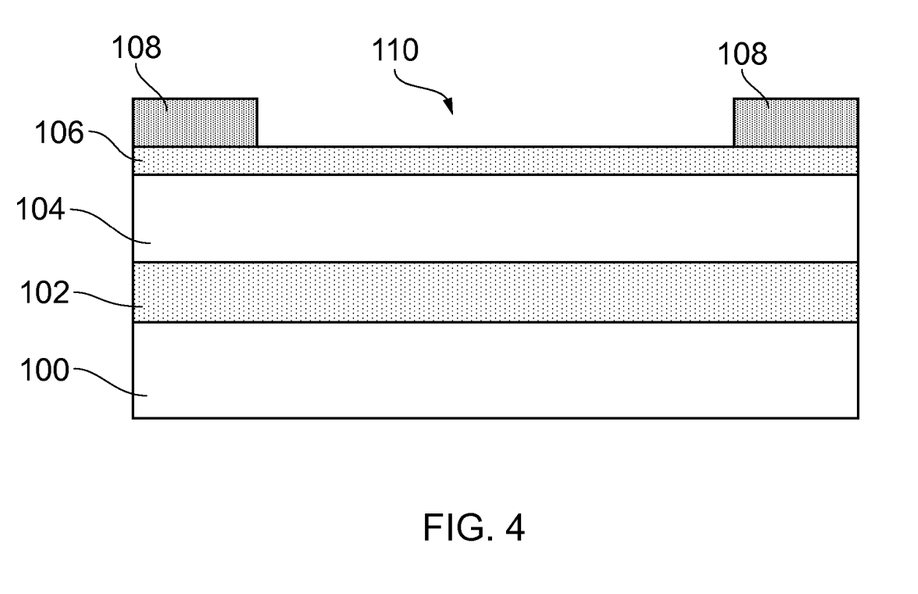
Figure 5:
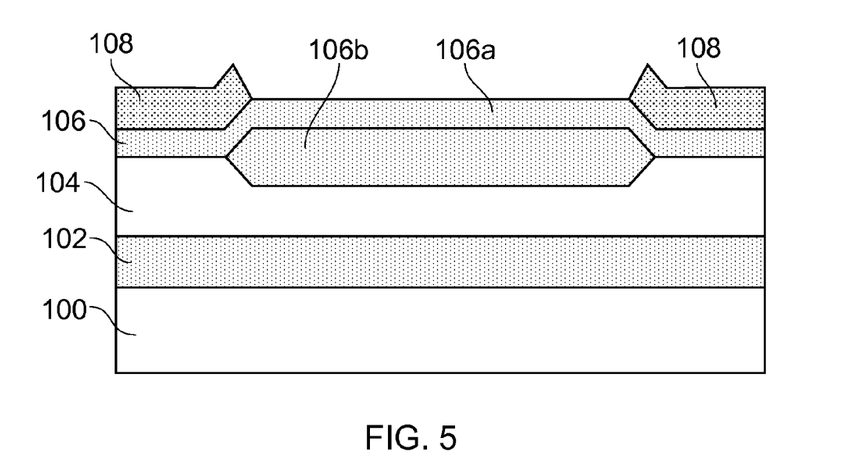

Next, as shown in FIG. 4, a patterned a hard mask layer is formed, typically of silicon nitride: the silicon nitride layer 108 is formed on the upper surface of the oxide layer 106 and is patterned according to known photolithographic techniques to form exposed area 110. The silicon nitride layer 108 typically has a thickness in the range of 30 nm-200 nm. Other suitable materials and/or thicknesses may be used for the patterned masking layer 108, as would be apparent to a person skilled in the art. The patterned masking layer 108 is referred to as a hard mask layer, since, in contradistinction to photoresist, which is commonly used as a masking layer, the silicon nitride layer is able to withstand the high-temperature processes required by the subsequent step of growing a thermal silicon oxide layer 106b, as shown in FIG. 5. Since the hard mask 108 prevents growth of oxide across the complete wafer, this layer is a LOCOS layer, as described above. The effect of this LOCOS growth is to locally thicken the oxide 106, which now comprises both the original oxide 106a, together with the local grown oxide 106b.

Figure 5A:
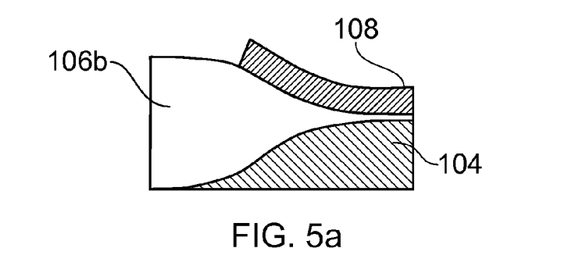

Also, as shown in FIG. 5, the hard mask layer 108 becomes deformed towards the edge of the LOCOS region, as the oxide grows, both laterally and vertically, from the exposed area 110. The process of this deformation results in the characteristic birds-beak profile at the edge of the LOCOS region, as is shown in more detail in insert FIG. 5a.

Figure 6:
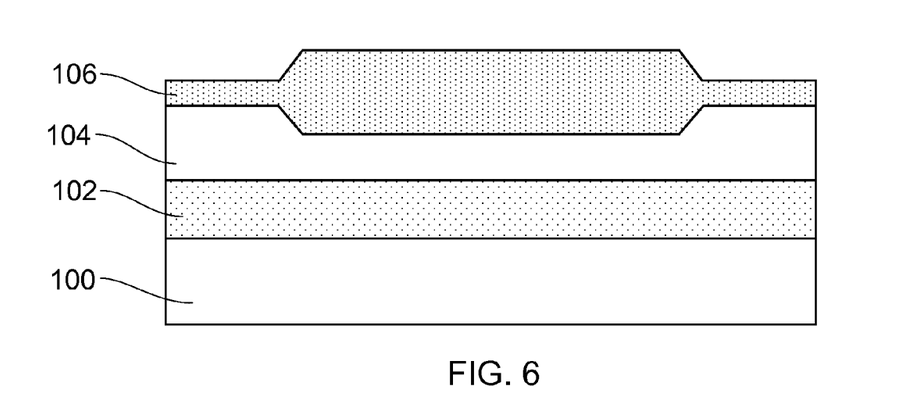

In one or more embodiments, the silicon nitride layer 108 is then removed, resulting in the structure illustrated in FIG. 6. The oxide layer 106 is then also removed, resulting in the structure illustrated in FIG. 7. It will be noted that at as a result, the surface 705 of the device includes a recess 710.

Figure 7:
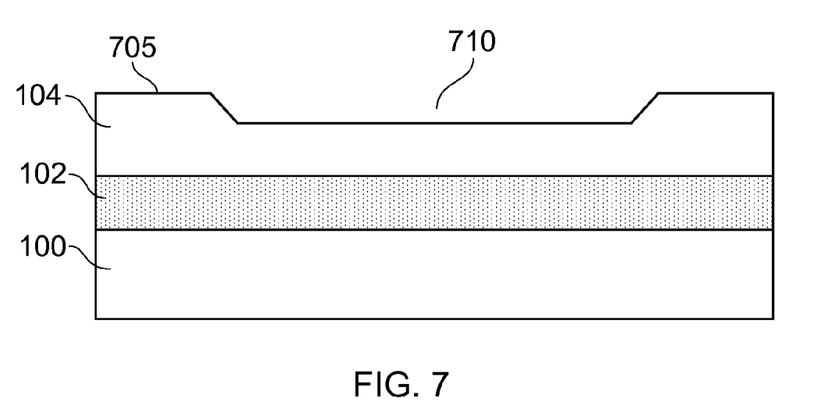

In other embodiments, the silicon nitride layer 108 is not removed at this stage in the process, but is left in place. In such embodiments, part of the field oxide 106a which is underneath the silicon nitride mask is left intact when the LOCOS layer 106b is removed. In such embodiments the silicon nitride layer 108 is used instead of a second silicon nitride layer 114 defining the second LOCOS layer (see below); consequently, a lithographic stage used to pattern the nitride mask 114 is not required, thereby saving a "maskstep". Since the field oxide 106a is still in place outside of the region of the recess 710, it is generally not required to grow a further field oxide 112 in such embodiments. However, these embodiments are generally compatible with only thinner recessed LOCOS layers, in part due to the "birds-beak" deformation of the edge of the silicon nitride used as mask in a thick LOCOS growth.

At this stage in the process, it will be noted that the epi layer 104 has therein a recess 710, having a well-defined depth, the depth being determined by the thickness of the previously grown and then removed LOCOS layer. Moreover, the sidewalls of the recess are not vertical, but have a tapered profile corresponding to the birds beak profile of a LOCOS layer. In contrast, were the recess to have been formed by directly etching the epi layer 104, its depth would have been much harder to accurately control, and the tapered profile at the edge would be different: in the case of anisotropic etching, the edge profile would have been vertical or near vertical; in the case of isotropic etching, the edge profile would have a characteristic rounded bottom corner, together with a sharp top corner.

It will be appreciated, that as drawn in the subsequent figures, the edge of the recess is shown as tapered, but the birds-beak profiling (resulting in the "lower corner" and "upper corner" both being smooth or rounded) is not shown, in order to keep the figures as simple and clear as possible.

Figure 8:
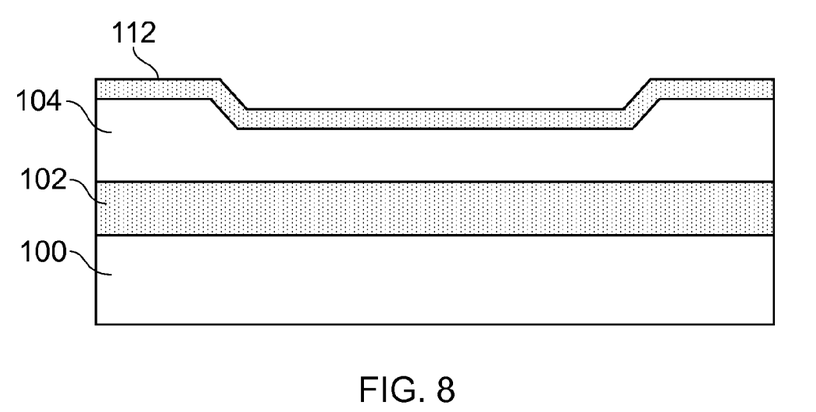

Since the original field oxide 106 was removed as part of the etching process to define the recess, a "replacement" (field) oxide layer 112 covering the upper surface of the SOI layer 104, is then grown as illustrated in FIG. 8. Here, the thickness of the oxide layer 112 is in the range of 5 nm-200 nm. Of course, other suitable materials and/or thicknesses may be used, as would be apparent to a person skilled in the art.

Figure 9:
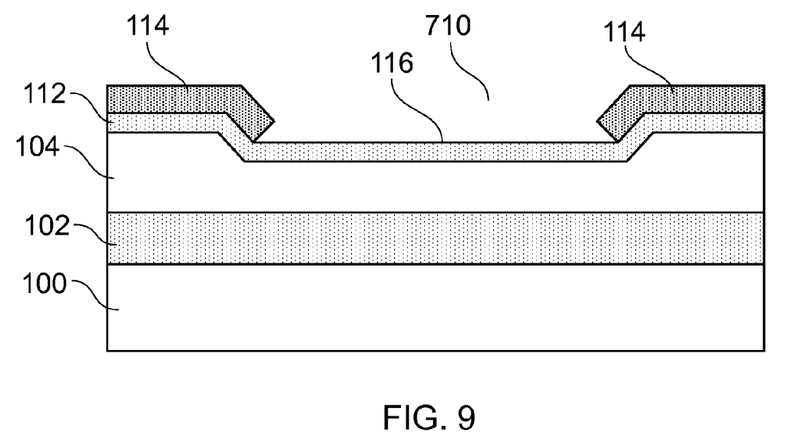
Figure 10:
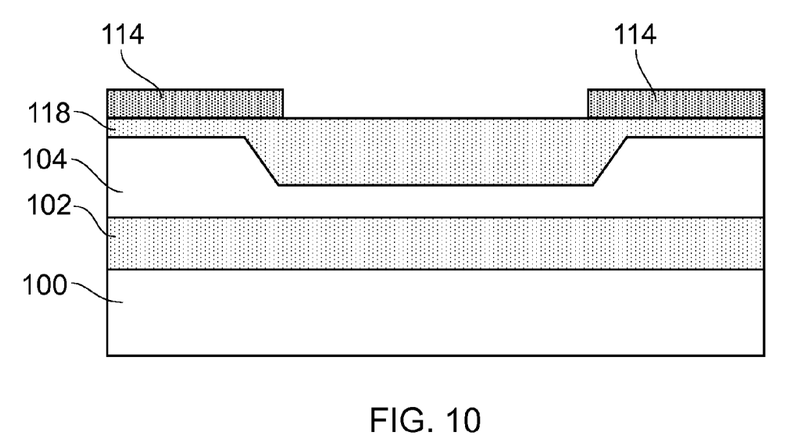

Next, a new LOCOS oxide layer is formed in the recess: as shown in FIG. 9, a "patterned hard mask", that is to say a masking layer typically of silicon nitride 114, is formed on the upper surface of the (field) oxide layer 112 and is patterned according to known photolithographic techniques to form exposed area 116 above the (field) oxide layer 112. The silicon nitride layer 114 typically has a thickness in the range of 30 nm-200 nm. Other suitable materials and/or thicknesses may be used for the patterned masking layer 108, as would be apparent to a person skilled in the art. The nitride protects the underlying silicon from oxidizing, while allowing a thermal silicon dioxide $SiO_2$ layer to grow in the exposed area 116. Accordingly, such selective (that is to say, LOCOS) growth of the (field) oxide layer 112 on silicon layer 104 masked by the patterned masking silicon nitride layer 114 results in a recessed (field) oxide layer 118 as shown in FIG. 10. The masking silicon nitride layer 114 is then removed, resulting in the structure illustrated in FIG. 11.

Figure 11:
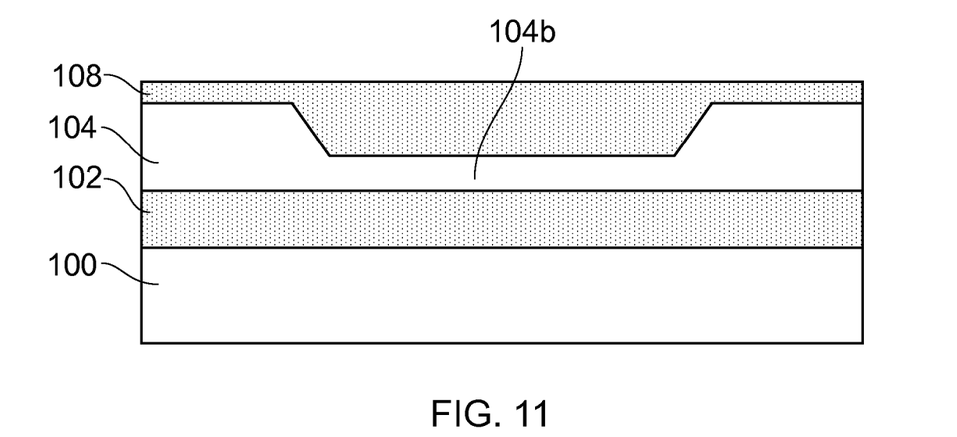

Since this second LOCOS layer is grown within the recess formed by the previously grown and removed LOCOS layer 106 layer, its initial surface is below that of the field oxide 112. However, as explained above as the LOCOS layer grows and consumes on silicon, it protrudes above its initial surface. By a suitably choosing the thickness of this LOCOS, the final surface of the LOCOS may be made coplanar with the surface of the field oxide. That is to say, by growing the LOCOS within a recess, it is possible to achieve a planar device surface without requiring any CMP etching. It should also be noted, that by a suitable choice of the silicon on insulator layer 104 (epi layer), it may be chosen that a thin layer of the epitaxial silicon remains underneath the recessed LOCOS. Moreover, since it is possible to accurately control the thickness of the second LOCOS layer, the depth of silicon which is consumed by this growth may equally be accurately controlled, and thus the thickness of the remaining thin layer of silicon at 104b may also be accurately controlled.

As mentioned, the upper surface of the (field) oxide layer 118 has a substantially flat (i.e. planar) top surface as shown in FIG. 11. A flat top surface for the oxide layer 118 may be beneficial since it may provide for improved lithography accuracy in subsequent lithography processing steps. The skilled person will appreciate that surface planarity becomes increasingly important with smaller process nodes, that is to say with smaller minimum feature sizes. This is due to the fact that as the lateral dimensions of lithography become smaller, the vertical depth of field for proper resolution of the lithographic process itself becomes smaller. Non-planar surface topographies thus becomes an increasingly severe problem for smaller process nodes. For sub-micron processes, and even more particularly for deep submicron processes, the surface irregularities caused by stress relaxation after CMP polishing may be sufficient to prevent proper resolution of the lithographic steps.

The insulating structure 118 formed using the LOCOS process steps may provide for improved oxide quality, and has what may be referred to as tapered oxide edge. Such a tapered oxide layer 118 may improve electrical field distribution and reliability. Also, the resultant insulating structure 118 has a substantially flat or planar upper surface, thereby enabling trench isolation formation using a BCD process. The structure shown in FIG. 11 is thus particularly suitable for use as a HV (High voltage) extension of a semiconductor device that has been formed using LOCOS processing steps. BCD process steps can be undertaken after such LOCOS process steps to construct trench isolation and well formations above the insulating structure.

Figure 12:
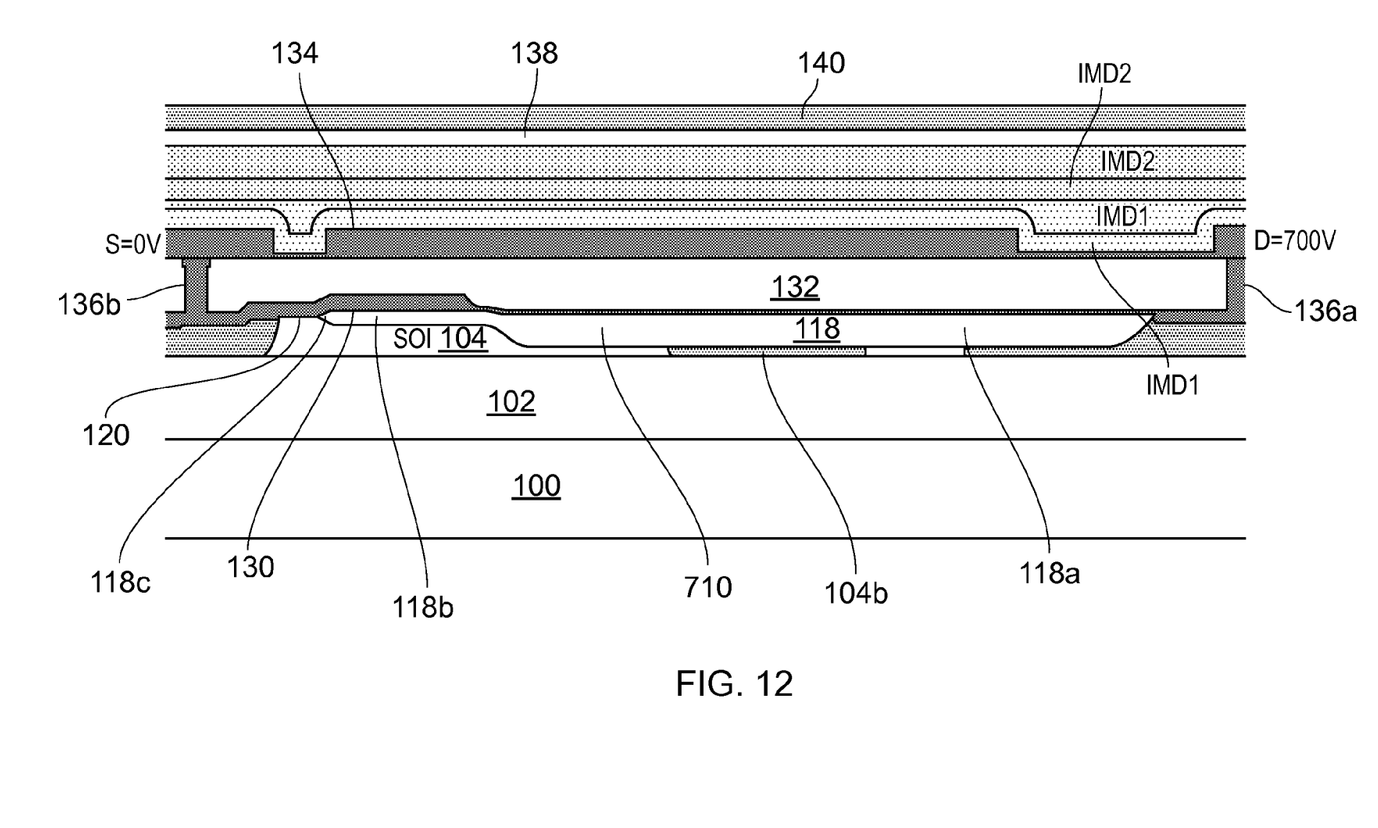
FIG. 12 depicts a cross sectional view of a HV semiconductor transistor according to one or more embodiments.

A cross section of a semiconductor transistor according to one or more embodiments is depicted in FIG. 12. The transistor comprises a wafer substrate 100; a buried oxide insulation layer 102 formed above the substrate 100, and a Silicon-on-Insulator (SOI) layer 104 formed on the buried oxide insulation layer 102. An insulating layer 118 is formed on the SOI layer 104 as a recessed LOCOS. At one end of the device (shown at the right hand side of the figure) is located a drain D of the transistor, having drain metallisation via 136; at the other end (shown on the left-hand side figure) is located a source S of the transistor, having source metallisation via 136. The insulating layer 118 has a substantially planar upper surface and is recessed into the SOI layer 104, resulting in the part 104b of SOI layer 104 which underneath the insulating layer being thinner, than the remainder to the layer SOI 104. At the end of the insulating layer 118a that is proximal to the drain, the end profile of the recessed low cross has smoothly curved and tapered profile which is characteristic of and corresponds to the formation of the recess by means of a sacrificial LOCOS layer, as described above with respect to the FIGS. 2 to 11.

In the embodiment shown, the insulating layer extends beyond the recessed LOCOS layer 118a, and provides a further region, which is generally known as the "field oxide layer" 118b, proximal to the source contact. Although as described so far, this further region 118b has been described as an extension to the recessed LOCOS part 118a of the insulating layer 118, the skilled person will recognise the structure and will be familiar with the more common terminology in which the recessed LOCOS part 118a is considered to be the extension: in other words, the further region 118b is considered as the field oxide, and the recessed LOCOS part 118a of the insulating layer 118 is referred to as an extension, and most typically as the high-voltage extension, to the field oxide. The high-voltage extension may enable the transistor to being operated at high voltages, for instance the transistor may be able to withstand a drain-source voltage (Vds) of up to or even exceeding 700V. The SOI layer, which starts at the end of the channel 120, and extends underneath the gate oxide, and underneath the further region 118b and the recessed LOCOS part 118a is generally termed the drift region of the device ("drift" referring to the carrier transport mechanism).

The recessed LOCOS, being situated at the drain D side of the transistor to cater for the higher voltages that will be present in the silicon on the drain side of the transistor. As will be familiar to the skilled person, the silicon on insulator 104b is doped with a non-uniform lateral doping profile which varies laterally, in order to provide for the well-known RESURF effect. In embodiments, the doping may increase linearly across the device. In other embodiments, the doping may increase in a generally quadratic fashion across the device to provide for an optimal RESURF effect. The SOI layer beneath the recess is comprised in a drift region of the lateral semiconductor device.

A polysilicon fieldplate 130 is formed on the source S side of the SOI layer 104 and the field oxide part 118b of the insulating layer 118 so that the polysilicon fieldplate 130 covers at least the field oxide part 118b of the insulating layer 118. In other embodiments, the polysilicon field plate 130 may extend partially over the recessed LOCOS part 118a of the insulating layer 118.

The remaining stages of fabrication of the transistor according to embodiments will be familiar to the skilled person; some aspects are mentioned briefly hereinbelow for completeness:

An Inter Layer Dielectic (ILD) layer 132 is formed to cover the insulating layer 118 and the polysilicon fieldplate 130. A metal fieldplate 134 is formed on the ILD layer 132, and the electrical contacts for the source S and drain D of the transistor are formed in the metal layer 134. The source S and drain D contacts make electrical contact with the source and drain implants of the SOI layer 104 using contact vias 136. A plurality of Inter Metal Dielectric (IMD) layers IMD1, IMD2 are sequentially stacked on the metal layer 134, and a passivation oxide layer 138 is formed on the uppermost IMD layer IMD2. Finally, a passivation nitride layer 140 is formed on the passivation oxide layer 138. Other process steps, such as are commonly used in BCD process technology, and will be familiar to the skilled person, may also be carried out, such as without limitation the formation of doped "well" regions, and isolation of individual components by trench isolation. It should be noted that, in general, these processes should be carried out after the formation of the recessed LOCOS layer; since the "thermal budgets", that is to say the combination of temperatures and times, of these processes are low. In particular, some of these processes would not be able to withstand the high thermal budgets (that is to say a high-temperature for a relatively long period of time) associated with providing a LOCOS isolation region.

From FIG. 12, it will be seen that the transistor comprises an insulating layer 118 extending laterally between the source S and drain D. The insulating layer 118 has a substantially planar upper surface and is recessed in the SOI layer 104. The insulating layer has a non-vertical end profile, which is characteristic of LOCOS oxide growth. Accordingly, in a typical embodiment such as that described above with reference to FIG. 12, a HV extension of a 700V MOS transistor may be fabricated prior to the trench isolation and well formations formed using a BCD process.

In embodiments, the MOS channel, shown at 120, may be the same as for a low voltage device and thus created during the standard BCD process.

Figure 13:
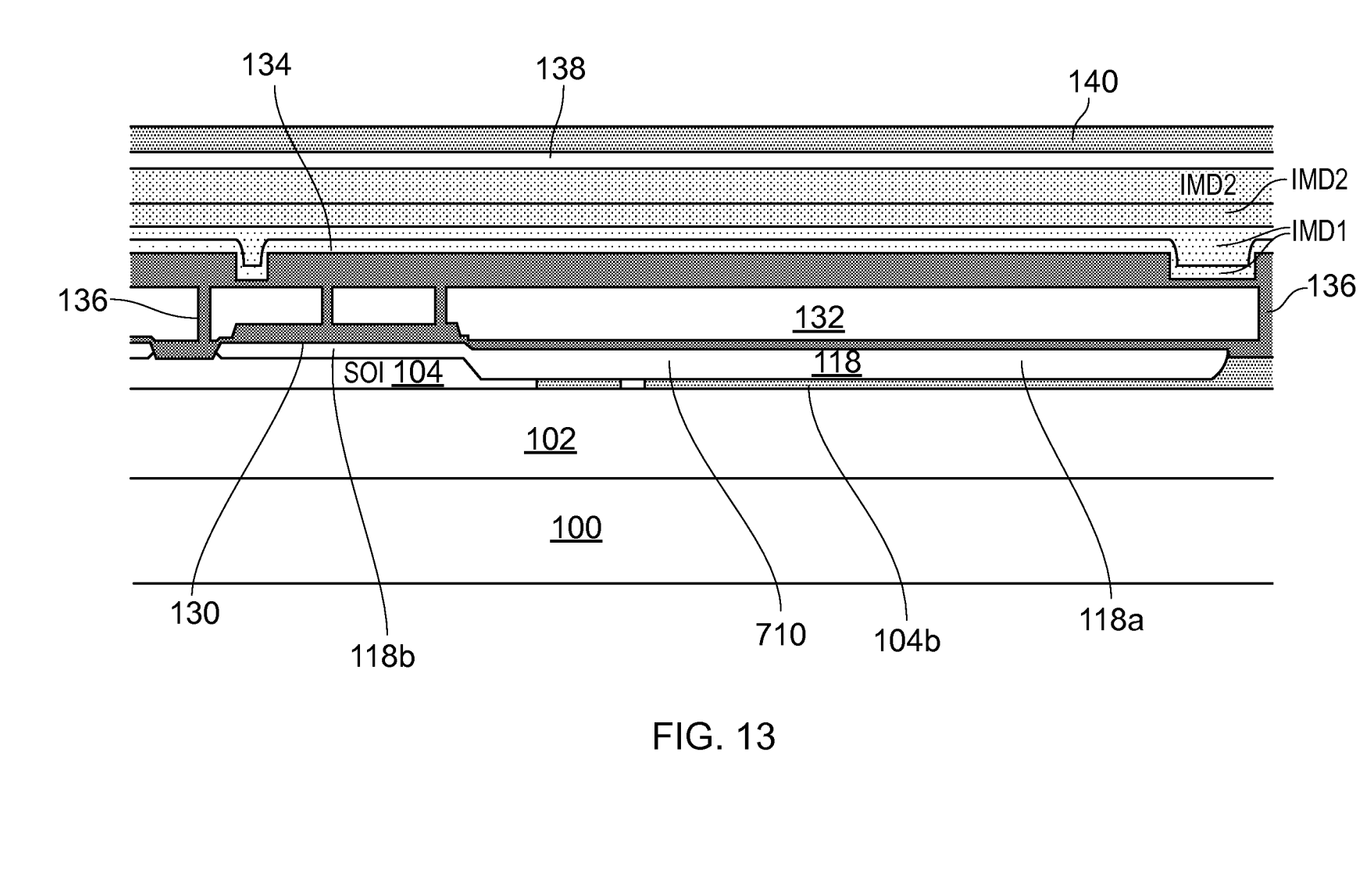
FIG. 13 depicts a cross sectional view of a HV junction field-effect transistor according to one or more embodiments.
Figure 14:
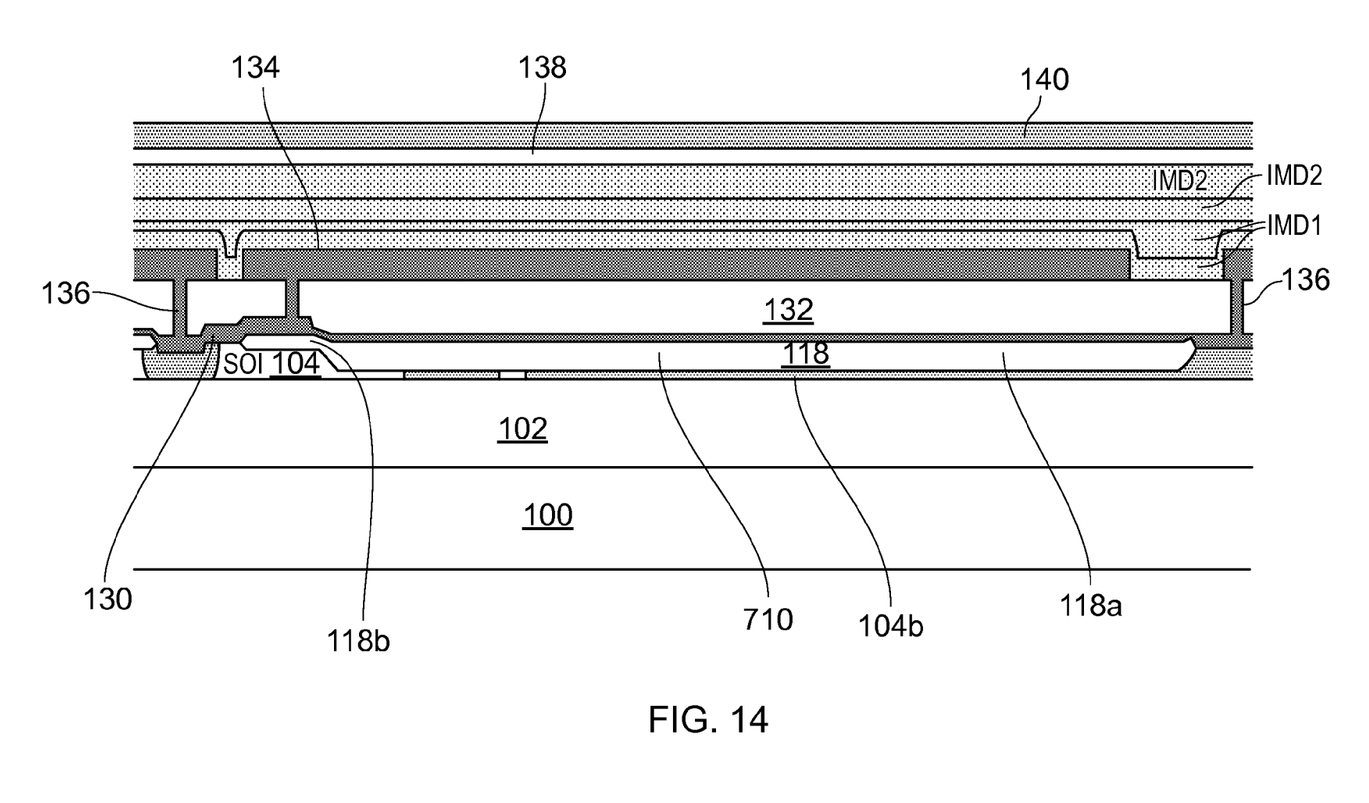
FIG. 14 depicts a cross sectional view of a HV diode according to one or more embodiments.
Figure 15:
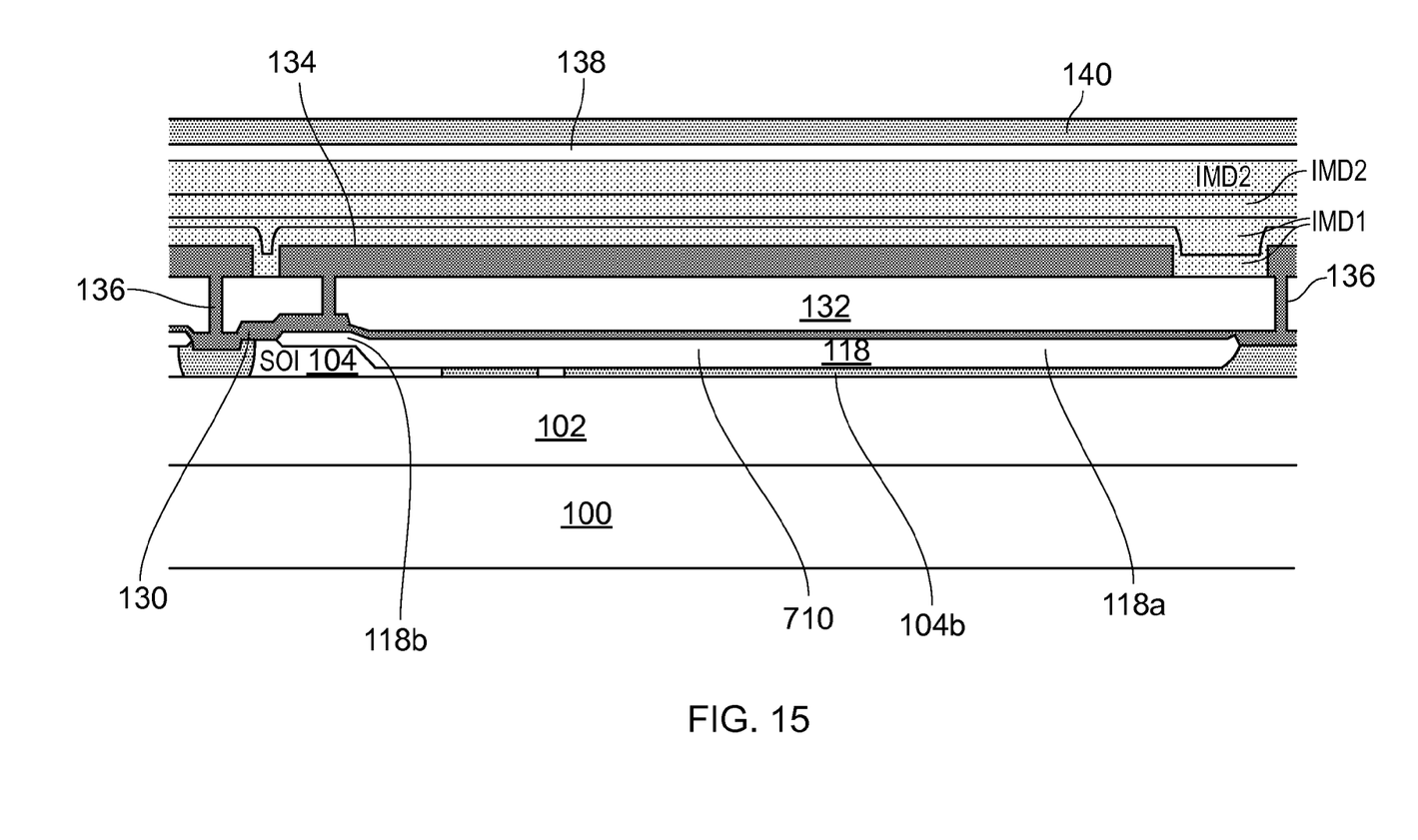
FIG. 15 depicts a cross sectional view of a Lateral Insulated-Gate Bipolar Transistor according to one or more embodiments.

Although an embodiment described above with reference to FIG. 12 relates to a HV extension of a MOS transistor such as a 700V MOS transistor, and, other embodiments may relate to HV extensions of other semiconductor devices. For example, embodiments may provide: a HV junction field-effect transistor (JFET) as illustrated in FIG. 13; a HV diode as illustrated in FIG. 14; a Lateral Insulated-Gate Bipolar Transistor (LIGBT) as illustrated in FIG. 15; or a Thyristor (or any combination thereof). Further, other embodiments may provide a HV capacitor.

From inspection of FIGS. 12 to 15, in which corresponding layers are referenced using the same numerals, it will be immediately apparent that the embodiments have in common the presence of a recess, a layer of LOCOS silicon oxide within the recess and having a grown upper surface which is coplanar with the surface of an un-recessed portion of the silicon layer, wherein the silicon layer beneath the recess has a non-uniform lateral doping profile, and is comprised in a drift region of the lateral semiconductor device.

The embodiments described above include a buried oxide, BOX, layer 102, and the devices are generally SOI devices. The skilled person will, however appreciate that the invention is not limited thereto; for example, the handling wafer 100 and the buried oxide layer 102 may be replaced by a semi-insulating silicon substrate. In such embodiments, the semi-insulating nature of the silicon substrate may have an equivalent effect to the buried oxide layer 102, and provide a degree of political isolation.

In embodiments, the field oxide 112 is itself formed by a LOCOS process. That is to say, the oxide may not be formed over the entire device but may be formed only over a locally exposed region. In such embodiments, an end of the part 118b of the field oxide which is closest to the source S, may have a tapered, and in particular a birds-beak, profile. This may be seen, for instance in FIG. 12 at 118c. It will be appreciated, that the growth of a LOCOS oxide layer will result in some degree of non-planarity or un-evenness of the surface. However, since the field oxide is generally much thinner than the recessed LOCOS, the impact of this may not be significant. In other embodiments, the field oxide 112 may be grown across the entire wafer, and etched back where not required. Also in these embodiments, a degree of non-planarity will result, which may in general be larger than by use of a LOCOS process. The skilled person will be aware that in known processes technologies, which do not have a LOCOS region, a field oxide 112 is generally not used.

A die, or chip, according to embodiments may be used in a wide variety of electronic components and circuits. Of particular importance are lighting circuits, and embodiments may extend to driver circuits for lighting devices, such as a compact fluorescent lamps or light emitting diode (LED) lamps. In order to be cost-effective, it may be desirable that such lighting lamps can operate direct from a mains supply which may be operable at several hundred volts. Driver circuits to power such lamps may therefore be required to operate at such high voltages. Provision of a semiconductor die which is compatible with such high voltage operation, and yet is also compatible with sub micron or even deep submicron manufacturing technology may enable smaller devices and thus facilitating a more devices per manufactured wafer, with a resulting decrease in the overall manufacturing cost per die.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signalling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metals are examples of other conductors.

The terms contact and via, both refer to structures for electrical connection of conductors at different interconnect levels. These terms are sometimes used in the art to describe both an opening in an insulator in which the structure will be completed, and the completed structure itself. For purposes of this disclosure contact and via may refer to the completed structure. The term vertical, as used herein, may mean substantially orthogonal to the surface of a substrate. The term lateral, as used herein, may mean substantially parallel to the surface of a substrate. Also, terms describing positioning or location (such as above, below, top, bottom, etc.) are to be construed in conjunction with the orientation of the structures illustrated in the diagrams.

From reading the present disclosure, other variations and modifications will be apparent to the skilled person. Such variations and modifications may involve equivalent and other features which are already known in the art of semiconductor device processing and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A semiconductor die comprising a lateral semiconductor device on an upper major surface of a substrate, the semiconductor die further comprising:
    a silicon layer over the substrate having a conductivity type,
    a recess in the silicon layer,
    a layer of LOCOS silicon oxide within the recess and having a grown upper surface which is coplanar with the surface of an un-recessed portion of the silicon layer,
    wherein a portion of the silicon layer is beneath the recess and has a non-uniform quadratic lateral doping concentration profile of the conductivity type, and is comprised in a drift region of the lateral semiconductor device; and
    wherein a thickness of the layer of LOCOS silicon oxide within the recess is greater than a thickness of the silicon layer beneath the recess.

2. A semiconductor die according to claim 1, wherein the lateral semiconductor device is a high voltage device having a lateral high voltage extension and wherein the silicon layer beneath the recess comprises the high voltage extension.

3. A semiconductor die according to claim 1, wherein the recess in the silicon layer has a tapered edge.

4. A semiconductor die according to claim 1, wherein the LOCOS silicon oxide at the tapered edge has a birds-beak profile.

5. A semiconductor die according to claim 1,
    further comprising a second LOCOS silicon oxide layer outside of the recess and coupled to the layer of LOCOS silicon oxide within the recess,
    wherein the second LOCOS silicon oxide layer has a thickness which is less than that of the LOCOS silicon oxide layer within the recess.

6. A semiconductor die according to claim 5,
    further comprising a polysilicon field plate extending over the second LOCOS silicon oxide layer outside of the recess,
    wherein the polysilicon field plate does not extend over the LOCOS silicon oxide layer within the recess.

7. A semiconductor die according to claim 1, wherein the silicon layer over the substrate is spaced apart from the substrate by a buried oxide layer.

8. A semiconductor die according to claim 1, wherein the lateral semiconductor device is a one of the group consisting of: a junction field effect transistor, an insulated gate field effect transistor, an insulated gate bipolar transistor, and a diode.

9. A semiconductor die according to claim 1, wherein the lateral semiconductor device is a bipolar device, and further comprising one or more CMOS devices.

10. A semiconductor die according to claim 1, wherein the recess in the silicon layer extends for a part of distance between two main contacts of the lateral semiconductor device.

11. A semiconductor die according to claim 1, wherein the lateral semiconductor device comprises a channel, the channel having a minimum channel length of no more than 250 nm.

12. An integrated circuit comprising a silicon die as claimed in claim 1.

13. A driver circuit for at least one of a compact fluorescent lamp or a light emitting diode lamp, comprising at least one semiconductor die according to claim 1.

14. The semiconductor die of claim 1,
    wherein the semiconductor die is configured to be fabricated using a Bipolar CMOS DMOS (BCD) process.

* * * * *